(12) United States Patent
Xie et al.

(10) Patent No.: US 11,276,735 B2
(45) Date of Patent: Mar. 15, 2022

(54) ARRAY SUBSTRATE, METHOD OF FABRICATING ARRAY SUBSTRATE, DISPLAY PANEL, AND DISPLAY DEVICE

(71) Applicant: BOE TECHNOLOGY GROUP CO., LTD., Beijing (CN)

(72) Inventors: Dini Xie, Beijing (CN); Wei Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 475 days.

(21) Appl. No.: 16/333,437

(22) PCT Filed: Aug. 14, 2018

(86) PCT No.: PCT/CN2018/100380
§ 371 (c)(1),
(2) Date: Mar. 14, 2019

(87) PCT Pub. No.: WO2019/080609
PCT Pub. Date: May 2, 2019

(65) Prior Publication Data
US 2021/0335907 A1    Oct. 28, 2021

(30) Foreign Application Priority Data
Oct. 25, 2017   (CN) .......................... 201711007645.8

(51) Int. Cl.
*H01L 27/32* (2006.01)
*H01L 51/56* (2006.01)

(52) U.S. Cl.
CPC ...... *H01L 27/3218* (2013.01); *H01L 27/3213* (2013.01); *H01L 27/3246* (2013.01); *H01L 51/56* (2013.01)

(58) Field of Classification Search
CPC ............. H01L 27/3218; H01L 27/3213; H01L 27/3211; H01L 27/3216; H01L 27/3206; H01L 27/3246; H01L 51/56
(Continued)

(56) References Cited

U.S. PATENT DOCUMENTS

| 2007/0132356 A1 | 6/2007 | Hashimoto et al. |
| 2009/0195144 A1* | 8/2009 | Kitabayashi ........ H01L 27/3246 313/503 |

(Continued)

FOREIGN PATENT DOCUMENTS

| CN | 104241329 A | 12/2014 |
| CN | 104465671 A | 3/2015 |

(Continued)

OTHER PUBLICATIONS

International Search Report dated Nov. 14, 2018, issued in counterpart Application No. PCT/CN2018/100380 (9 pages).

(Continued)

*Primary Examiner* — Didarul A Mazumder
(74) *Attorney, Agent, or Firm* — Westerman, Hattori, Daniels & Adrian, LLP (57) ABSTRACT

The present disclosure generally relates to display technologies, and in particular, to an array substrate, a method of fabricating array substrate, a display panel including the array substrate, and a display device including the display panel. The array substrate includes a substrate; a plurality of sub-pixel units provided on the substrate, each sub-pixel unit including a pair of sub-pixels; a first pixel defining portion provided between the pair of sub-pixels in a sub-pixel unit; a second pixel defining portion provided between a pair of adjacent sub-pixel units. The height of the first pixel defining portion is lower than the height of the second pixel defining portion.

15 Claims, 9 Drawing Sheets

(58) Field of Classification Search
USPC .................................. 257/40; 438/82, 99
See application file for complete search history.

(56) References Cited

U.S. PATENT DOCUMENTS

| | | | |
|---|---|---|---|
| 2011/0198598 A1* | 8/2011 | Kim | H01L 27/3246 |
| | | | 257/59 |
| 2014/0147950 A1* | 5/2014 | Choi | H01L 51/0005 |
| | | | 438/46 |
| 2014/0197396 A1 | 7/2014 | Madigan | |
| 2016/0056218 A1 | 2/2016 | Wang et al. | |
| 2016/0077392 A1 | 3/2016 | Leu et al. | |
| 2017/0194602 A1* | 7/2017 | Cui | H01L 27/3283 |

FOREIGN PATENT DOCUMENTS

| | | |
|---|---|---|
| CN | 104659069 A | 5/2015 |
| CN | 105206643 A | 12/2015 |
| CN | 106783936 A | 5/2017 |
| CN | 106920828 A | 7/2017 |
| CN | 106935624 A | 7/2017 |
| CN | 107968107 A | 4/2018 |
| GN | 104851903 A | 8/2015 |
| GN | 105206643 A | 12/2015 |

OTHER PUBLICATIONS

Office Action dated Apr. 22, 2020, issued in counterpart CN Application No. 201711007645 8, with English Translation. (21 pages).
Office Action dated Jun. 3, 2020, issued in counterpart CN Application No. 201711007645.8, with English Translation. (26 pages).
Extended (Supplementary) European Search Report dated Jun. 17, 2021, issued in counterpart EP Application No. 18855142.8, with Notification of communication dated Jul. 6, 2021. (8 pages).
Office Action dated Aug. 9, 2021, issued in counterpart CN Application No. 201711007645.8, with English Translation. (22 pages).

* cited by examiner

ARRAY SUBSTRATE, METHOD OF FABRICATING ARRAY SUBSTRATE, DISPLAY PANEL, AND DISPLAY DEVICE

CROSS-REFERENCE TO RELATED APPLICATIONS

This application claims the benefit of the filing date of Chinese Patent Application No. 201711007645.8 filed on Oct. 25, 2017, the entire disclosure of which is hereby incorporated by reference.

TECHNICAL FIELD

The present disclosure generally relates to the field of display technology, and in particular, to an array substrate, a method of fabricating the array substrate, a display panel including the array substrate, and a display device including the display panel.

BACKGROUND

The use of inkjet printing technology in the organic light-emitting diode (OLED) panel production process can significantly reduce the material cost. As such, the application of inkjet printing during OLED production is receiving more and more attention. In general, inkjet printing uses solvents to dissolve the organic materials in order to make the ink, which is then directly printed on the surface of the substrate to form an organic light-emitting layer. The principles of operation for inkjet printing in the context of OLED production are substantially identical to those of conventional printing.

However, existing printing technologies have limitations that make it difficult to apply inkjet printing to produce high-resolution OLED panels. More particularly, when ink is being dispensed into a pixel unit, the ink is prone to overflowing the bank of the pixel unit as a result of the size of the ink droplets. Overflowing causes undesirable mixing of colors between pixel units of different colors, among ether defects. As such, existing printing technologies make it difficult to print OLED panels having small-sized pixel units.

BRIEF SUMMARY

One embodiment of the present disclosure is an array substrate. The array substrate may comprise a substrate; a plurality of sub-pixel units on a surface of the substrate, each sub-pixel unit comprising a pair of sub-pixels; a first pixel defining portion between the pair of sub-pixels in a sub-pixel unit; and a second pixel defining portion between adjacent sub-pixel units. A largest height of the first pixel defining portion may be lower than a largest height of the second pixel defining portion. The height of the first pixel defining portion may be measured in a direction perpendicular to the surface of the substrate on which the plurality of sub-pixel units are formed.

In at least some embodiments, the array substrate may further comprise an organic light-emitting layer provided on each of the pair of sub-pixels in the sub-pixel unit. A height of the organic light-emitting layer may be lower than the height of the first pixel defining portion.

In at least some embodiments, each of the first pixel defining portion and the second pixel defining portion may comprise a hydrophobic layer and a hydrophilic layer. In at least some embodiments, in each of the first pixel defining portion and the second pixel defining portion, the hydrophobic layer may be provided on a side farthest from the substrate, and the hydrophilic layer may be provided on a side closest to the substrate.

In at least some embodiments, organic light-emitting layers in the sub-pixel unit may be configured to emit lights of the same color.

In at least some embodiments, organic light-emitting layers in adjacent sub-pixel units may be configured to emit lights of different colors.

In at least some embodiments, the array substrate may comprise a plurality of rows of sub-pixel units. Each row may comprise an alternating arrangement of at least one first sub-pixel unit configured to emit a blue light, at least one second sub-pixel unit configured to emit a red fight, and at least one third sub-pixel unit configured to emit a green light. Adjacent rows may be aligned so that sub-pixel units in adjacent rows that are configured to emit the same color do not overlap.

In at least some embodiments, the array substrate may comprise a first row of sub-pixel units that comprises an alternating arrangement of two selected from the group consisting of a first sub-pixel unit configured to emit a blue light, a second sub-pixel unit configured to emit a red light, a third sub-pixel unit configured to emit a green light, and a fourth sub-pixel unit configured to emit a white light; a second row of sub-pixel units that comprises an alternating arrangement of the other two selected from the group consisting of a first sub-pixel unit configured to emit a blue light, a second sub-pixel unit configured to emit a red light, a third sub-pixel unit configured to emit a green light, and a fourth sub-pixel unit configured to emit a white light. The first row and the second row may be adjacent to each other and aligned so that the first sub-pixel unit, the second sub-pixel unit, the third sub-pixel unit, and the fourth sub-pixel unit are positioned sequentially about a virtual central point and each sub-pixel unit defines one quadrant about the virtual central point.

In at least some embodiments, the first pixel defining portion may separate the pair of sub-pixels in the sub-pixel unit, so that no portion of one of the pair of sub-pixels is in contact with the other of the pair of sub-pixels.

In at least some embodiments, a largest width of the first pixel defining portion may be narrower than a largest width of the second pixel defining portion.

Another embodiment of the present disclosure is a display panel. The display panel may comprise an array substrate as described above.

Another embodiment of the present disclosure is a display device. The display device may comprise a display panel as described above.

Another embodiment of the present disclosure is a method of fabricating an array substrate. The method may comprise forming a plurality of sub-pixel units on a surface of a substrate, each sub-pixel unit comprising a pair of sub-pixels; forming a pixel defining film on a substrate; forming a pattern in the pixel defining film, the pattern comprising a first pixel defining portion between the pair of sub-pixels in a sub-pixel unit and a second pixel defining portion between adjacent sub-pixel units; and forming an organic light-emitting layer on each of the pair of sub-pixels in the sub-pixel unit. A largest height of the first pixel defining portion may be lower than a largest height of the second pixel defining portion. The height of the first pixel defining portion may be measured in a direction perpendicular to the surface of the substrate on which the plurality of sub-pixel units are formed.

In at least some embodiments, the forming of the pattern may comprise exposing the pixel defining film through a single mask. The single mask may comprise a half-exposure region corresponding to the first pixel defining portion, and a full-exposure region corresponding to the second pixel defining portion.

In at least some embodiments, a height of the organic light-emitting layer may be lower than the height of the first pixel defining portion.

In at least some embodiments, a largest width of the first pixel defining portion may be narrower than a largest width of the second pixel defining portion.

In at least some embodiments, each of the first pixel defining portion and the second pixel defining portion may comprise a hydrophobic layer and a hydrophilic layer. In each of the first pixel defining portion and the second pixel defining portion, the hydrophobic layer may be provided on a side farthest from the substrate, and the hydrophilic layer may be provided on a side closest to the substrate.

In at least some embodiments, the method may further comprise dispensing ink simultaneously onto the pair of sub-pixels in the sub-pixel unit, and drying the ink to form the organic light-emitting layer.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the present disclosure are apparent from the following detailed description taken in conjunction with the accompanying drawings in which:

DETAILED DESCRIPTION

The embodiments of the present disclosure will be described clearly and concretely in conjunction with the accompanying drawings, which are described briefly above. The subject matter of the present disclosure is described with specificity to meet statutory requirements. However, the description itself is not intended to limit the scope of this disclosure. Rather, the inventors have contemplated that the claimed subject matter might also be embodied in other ways, to include different steps or elements similar to the ones described in this document, in conjunction with other present or future technologies.

While the present technology has been described in connection with the embodiments of the various figures, it is to be understood that other similar embodiments may be used or modifications and additions may be made to the described embodiments for performing the same function of the present technology without deviating therefrom. Therefore, the present technology should not be limited to any single embodiment, but rather should be construed in breadth and scope in accordance with the appended claims. In addition, all other embodiments obtained by one of ordinary skill in the art based on embodiments described in this document are considered to be within the scope of this disclosure.

Figure 1:
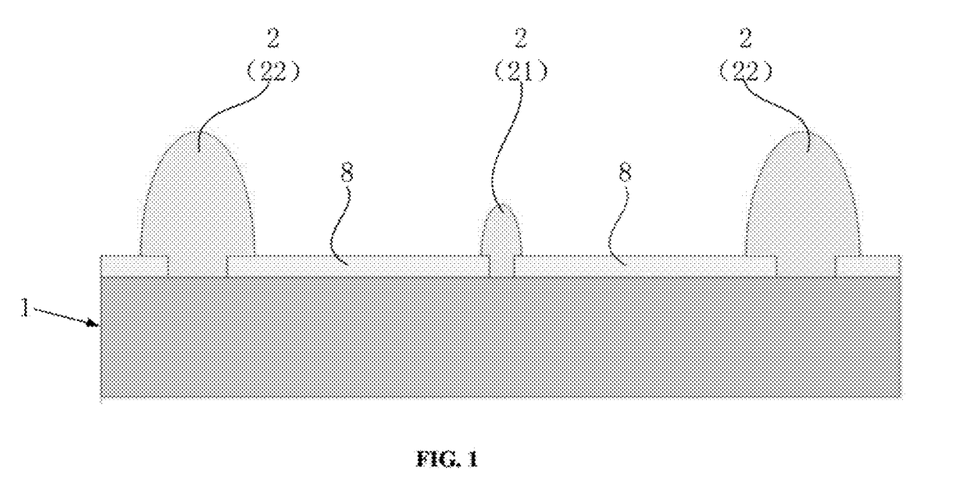
FIG. 1 shows a schematic diagram of a cross-sectional view of an array substrate according to an embodiment of the present disclosure.

FIG. 1 shows a schematic diagram of a cross-sectional view of an array substrate according to some embodiments of the present disclosure. As shown in FIG. 1, an array substrate includes a substrate 1, a plurality of sub-pixels (for example, shown in FIG. 4 as sub-pixels 51, 52, 53, 54) formed on a surface of the substrate 1, and a pixel defining layer 2 formed on the surface of the substrate 1. The pixel defining layer 2 is configured to demarcate regions of sub-pixels. A pair of adjacent sub-pixels constitutes a sub-pixel unit (for example, shown in FIG. 4 as sub-pixel units 41, 42, 43, 44). A first pixel defining portion 21 is provided between the pair of sub-pixels making up the sub-pixel unit. The first pixel defining portion 21 may be "intra-unit". A second pixel defining portion 22 is provided between two adjacent sub-pixel units, that is, the second pixel defining portion 22 is "inter-unit".

Figure 2:
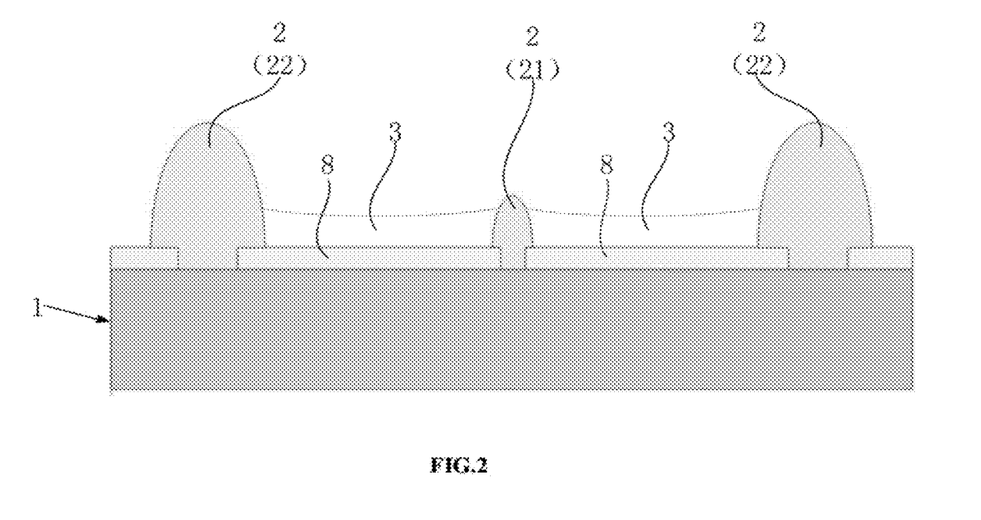
FIG. 2 shows a schematic diagram of a cross-sectional view of an array substrate according to another embodiment of the present disclosure.
Figure 3A:
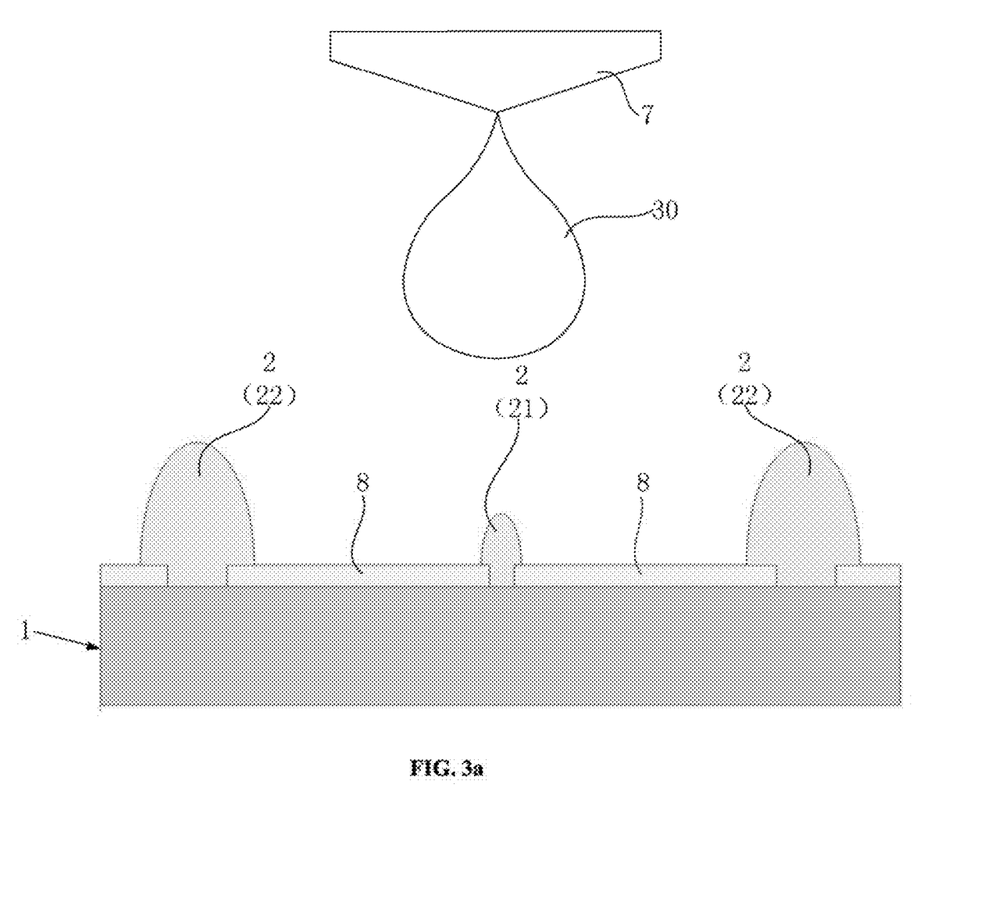
FIG. 3a shows a schematic diagram of the process of forming an organic light-emitting layer using the inkjet printing process according to an embodiment of the present disclosure.
Figure 3B:
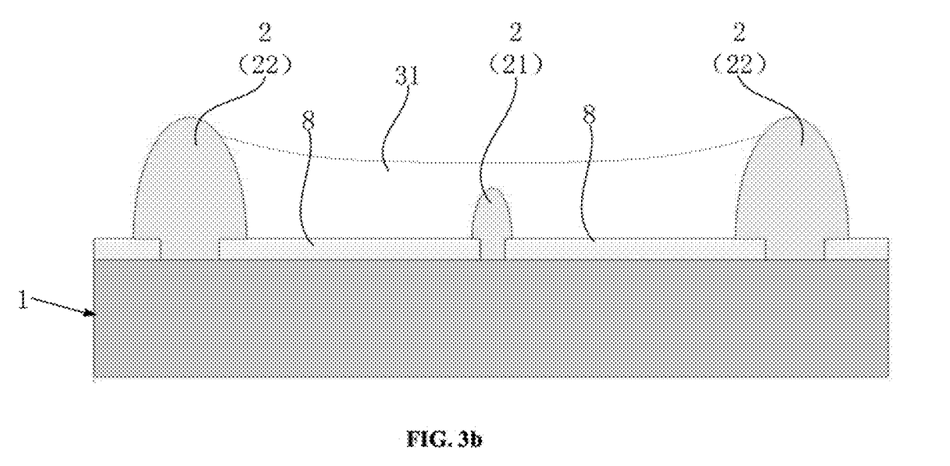
FIG. 3b shows a schematic diagram of the process of forming an organic light-emitting layer by an inkjet printing process according to another embodiment of the present disclosure.
Figure 3C:
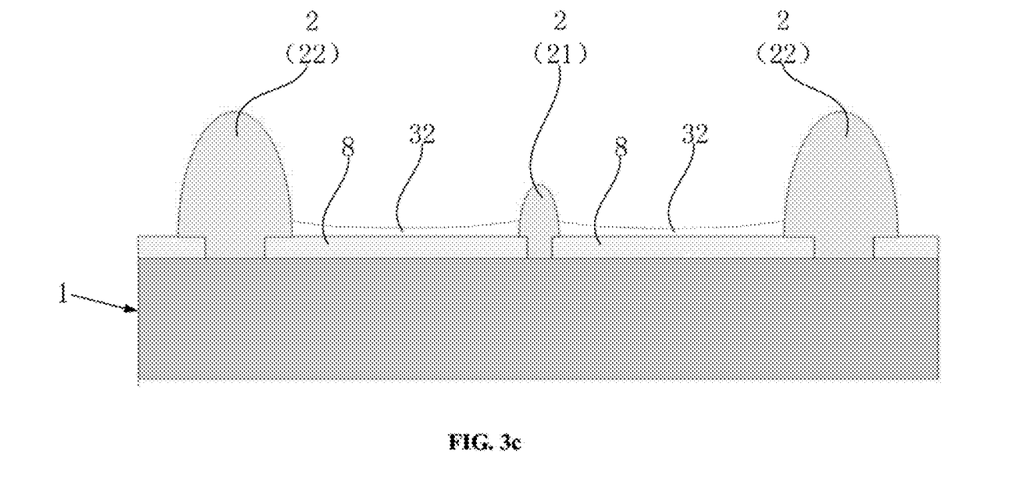
FIG. 3c shows a schematic diagram of an array substrate including an organic light-emitting layer formed by an inkjet printing process according to an embodiment of the present disclosure.

The largest height of the first Pixel defining portion 21 is lower than the largest height of the second pixel defining portion 22, for example as shown in FIGS. 1 to 3C. The height of the first and second pixel defining portions 21, 22 is measured in a direction perpendicular to the plane defined by the surface of the substrate on which the plurality of sub-pixels are formed. The relative heights of the intra-unit first pixel defining portion 21 and the inter-unit second pixel defining portion 22 make it possible, during the inkjet printing process, to position the printer nozzle 7 over the first pixel defining portion 21 and dispense the proper volume of ink simultaneously into the region of each sub-pixel of a sub-pixel unit 4, as defined by the sub-pixels themselves, for example, as shown in FIGS. 3a to 3c. Further, the risk of ink droplets 30 overflowing into neighboring sub-pixels outside of the sub-pixel unit (for example, due to the large size of the ink droplets 30) is reduced. Even when the resolution of the array substrate is increased, and the size of the sub-pixel units is reduced, the risk of ink droplets overflowing and contaminating neighboring pixels of different colors is low, so as to ensure the uniformity of the color within a sub-pixel unit. The present disclosure thus makes it possible to fabricate a high-resolution array substrate using inkjet printing without risking color-contamination of adjacent sub-pixel units.

FIG. 2 shows a schematic diagram of a cross-sectional view of an array substrate according to some embodiments of the present disclosure. As shown in FIG. 2, an array substrate includes a plurality of sub-pixels, and a pixel defining portion 2 formed on a substrate 1. The array substrate may additionally include an organic light-emitting layer 3 formed on each sub-pixel of a sub-pixel unit 4.

The height of each organic light-emitting layer 3 is lower than the height of the intra-unit first pixel defining portion 21. In some embodiments, the pair of organic light-emitting layers 3 within a sub-pixel unit may thus be separated entirely from each other by the intra-unit first pixel defining portion 21. The organic light-emitting layers 3 within a sub-pixel unit do not form a continuous layer. The sub-pixels of a sub-pixel unit are separate and independent from each other. In some embodiments, no portion of one of the pair of sub-pixels is in contact with the other of the pair of sub-pixels.

The pixel defining layer 2 comprises a hydrophobic layer and a hydrophilic layer. The method for forming the pixel defining layer is not particularly limited. The pixel defining layer 2 may be formed according to any suitable method known to a person of ordinary skill in the art. For example, the pixel defining layer may be formed by depositing a hydrophilic layer material and a hydrophobic layer material sequentially, and then forming the pixel defining layer through a patterning process. The hydrophobic layer is positioned farthest from the substrate 1. The hydrophobic layer is composed of a hydrophobic material, such as polymers having fluorinated carbon atoms, such as fluorinated polyimides, fluorinated polyesters; polydimethylsiloxanes, and the like. The hydrophilic layer is positioned closest to the substrate 1. The hydrophilic layer is composed of a hydrophilic material, such as acrylic resins, polyacrylate resins, polyimide resins, benzocyclobutene, and the like.

When using the inkjet printing process to form the organic light-emitting layer 3 (for example, as shown in FIGS. 3a to 3c), the composition of the pixel defining layer 2 makes it possible to prevent residual ink 31 from adhering to the top layer of the pixel defining layer 2, as the deposited ink 31 evaporates and dries. As shown in FIG. 3c, after the deposited ink 31 has dried, the solute remaining in the ink 31 forms an organic film layer 32 on each of the sub-pixels in a sub-pixel unit 4. The organic film layers 32 within a sub-pixel unit are separate and independent from each other, and do not form a continuous layer. This configuration further ensures the separateness of the sub-pixels 8 of a sub-pixel unit.

In some embodiments, the largest width of the intra-unit first pixel defining portion 21 is narrower than the largest width of the inter-unit second pixel defining portion 22. The relative widths of the pixel defining portions 21, 22 facilitate the simultaneous dispensing of the ink droplets 30 onto each of the two sub-pixels of a sub-pixel omit 4 during the inkjet printing process, for example, as shown in FIGS. 3a to 3c. During the inkjet printing process, immediately after ink has been dispensed, the pixel defining layer becomes submerged in the ink. If the pixel defining layer is configured to be wide with a flat surface, then as the ink evaporates, ink residues are liable to remain and accumulate on the pixel defining layer. This can have adverse effects on the subsequent processing of the pixel defining layer. By configuring the pixel defining portions in the manner described in the present disclosure, it is possible to minimize the accumulation of ink residues. The relative widths of the pixel defining portions also allow the size of the sub-pixel units to be reduced, so as to make it possible to increase the resolution of the array substrate. The present disclosure thus makes it possible to fabricate a high-resolution array substrate using inkjet printing without risking color-contamination of adjacent sub-pixel units.

Figure 4:
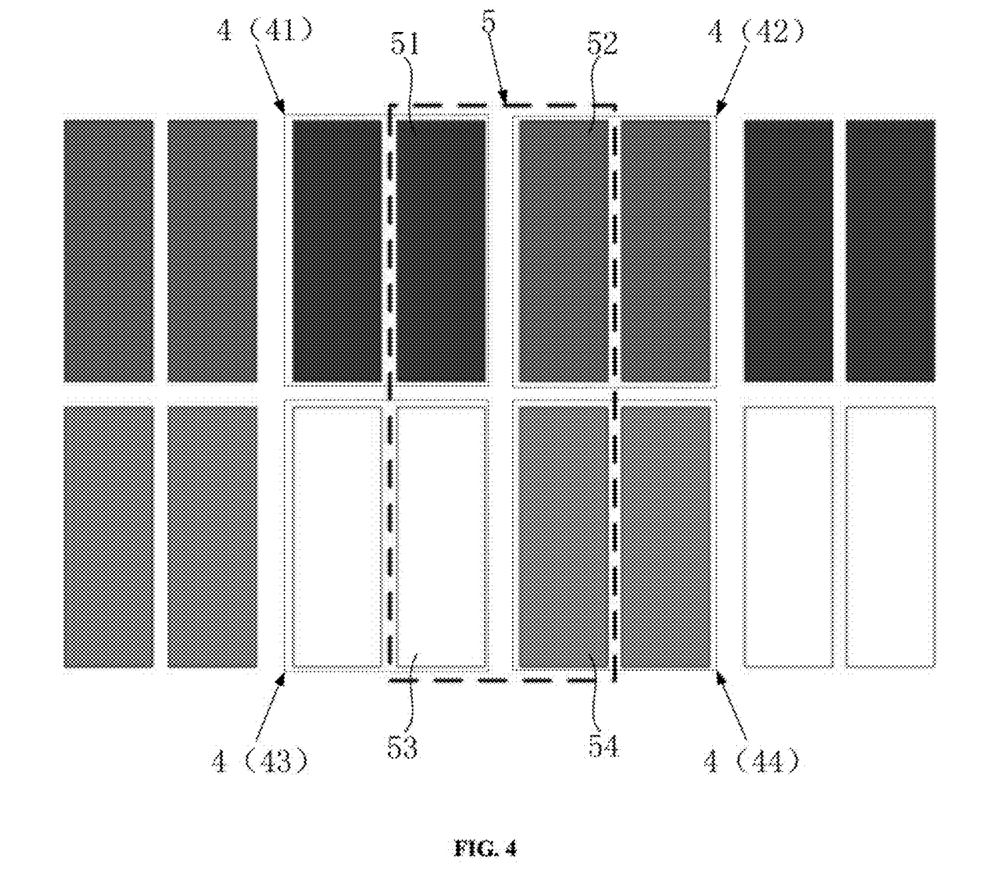
FIG. 4 shows a schematic diagram of an array substrate according to an embodiment of the present disclosure.

As shown in FIG. 4, in some embodiments of the present disclosure, the organic light-emitting layers 3 on the two sub-pixels in a sub-pixel unit 4 emit light of the same color. When using inkjet printing process to form the organic light-emitting layer 3, the printer nozzle 7 may be configured to dispense ink droplets 30 simultaneously onto the two sub-pixels in the sub-pixel unit 4 (for example, as shown in FIGS. 3a to 3c), so that two organic film layers 32 may be formed at one time (for example, as shown in FIGS. 3a to 3c). The organic light-emitting layers 3 formed in this manner emit light of the same color.

The present disclosure advantageously reduces the risk of ink droplets 30 overflowing into neighboring sub-pixels outside of the sub-pixel unit 4 (for example, due to the large size of the ink droplets 30) during the inkjet printing process. Further, the present disclosure significantly improves the efficiency of the inkjet printing process during production of the array substrate.

Also as shown in FIG. 4, in some embodiments of the present disclosure, the organic light-emitting layers 3 in neighboring sub-pixel units 4 emit lights of different colors. Further, neighboring sub-pixel units 4 may be configured so that the colors of lights emitted by the organic light-emitting layers 3 in the respective sub-pixel units 4 combine to produce a white light.

In other words, as shown in FIG. 4, in some embodiments, organic light-emitting layers 3 within a sub-pixel unit 4 emit light of the same color, while organic light-emitting layers 3 in neighboring sub-pixel units 4 emit lights of different colors.

In an array substrate according to the present disclosure, a first row of sub-pixels may be formed with organic light-emitting layers configured to emit lights of two different colors, while a second neighboring row of sub-pixels may be formed with organic light-emitting layers configured to emit lights of two additional, different colors. In some embodiments of the present disclosure, the sub-pixel units may be arranged so that colors from neighboring sub-pixel units can combine to produce a white light.

In some embodiments or the present disclosure, the array substrate contains blue sub-pixel units 4(41), red sub-pixel units 4(42), white sub-pixel units 4(43), and green sub-pixel units 4(44), for example, as shown in FIG. 4. A first row of sub-pixel may comprise an alternating arrangement of two selected from the group consisting of a first sub-pixel unit configured to emit a blue light, a second sub-pixel unit configured to emit a red light, a third sub-pixel unit configured to emit a green light, and a fourth sub-pixel unit configured to emit a white light. A second row of sub-pixel units, adjacent to the first row, may comprise an alternating arrangement of the other two selected from the group consisting of a first sub-pixel unit configured to emit a blue light, a second sub-pixel unit configured to emit a red light, a third sub-pixel unit configured to emit a green light, and a fourth sub-pixel unit configured to emit a white light. The first row and the second row are aligned so that the first sub-pixel unit, the second sub-pixel unit, the third sub-pixel unit, and the fourth sub-pixel unit are positioned sequentially about a virtual central point and each sub-pixel unit defines one quadrant about the virtual central point. As an illustrative example, if the two colors of the emitted lights from the first row are blue and red, and the two colors of the emitted lights from the second row are green and white, then as shown in FIG. 4, the blue sub-pixel unit 4(41) and the red sub-pixel unit 4(42) may be arranged in an alternating manner in the first row, while the green sub-pixel unit 4(44) and the white sub-pixel unit 4(43) are arranged in a similarly alternating manner in the second row. The first row and the second row are aligned in such a manner that the sub-pixel units 4(41), 4(42), 4(43), 4(44) are positioned sequentially about a virtual central point, and each sub-pixel unit 4(41), 4(42), 4(43), 4(44) defines one quadrant about the virtual central point. With the sub-pixels arranged as shown in FIG. 4, each of the sub-pixels 51, 52, 53, 54 defines a quadrant about a virtual central point, so that the colors of the emitted lights from sub-pixels 51, 52, 53, 54 within the area 5 will combine to produce a white light.

Figure 5:
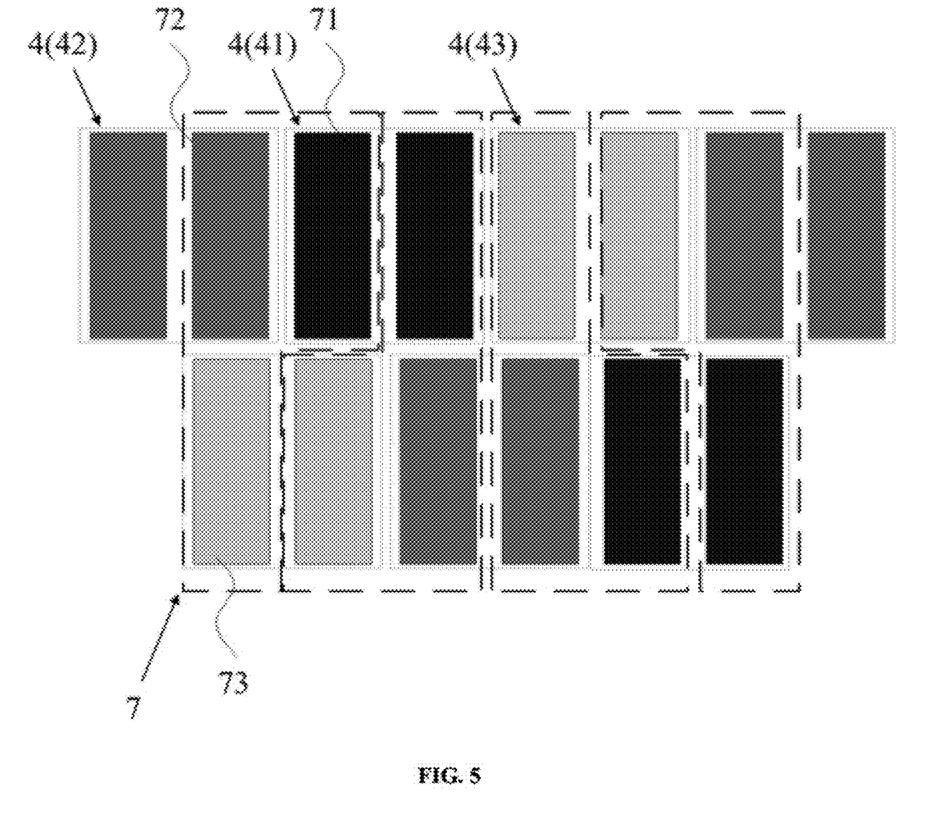
FIG. 5 shows a schematic diagram of an array substrate according to an embodiment of the present disclosure.

In some embodiments of the present disclosure, the array substrate contains blue sub-pixel units 4(41), red sub-pixel units 4(42), and green sub-pixel units 4(43), for example, as shown in FIG. 5. As shown in FIG. 5, the blue, red, and green sub-pixel units 4(41), 4(42), 4(43) are arranged in an alternating manner in each row of sub-pixel units. Further, the rows of sub-pixel units are aligned so that sub-pixel units of the same color in adjacent rows do not overlap with each other. This configuration makes it possible for the colors of the emitted lights from the sub-pixels 71, 72, 73 within each area 7 to combine to produce a white light.

As shown in FIGS. 1 to 3c, in some embodiments, an array substrate according to the present disclosure includes a pixel electrode 8 corresponding to each sub-pixel. The array substrate may further include a cathode, an anode, a pixel circuit, and other suitable components and/or accessories known to a person of ordinary skill in the art. It is understood that additional components and/or accessories may be provided within an array substrate of the present disclosure without departing from the spirit and scope of the present disclosure.

The present disclosure also provides a display panel comprising an array substrate as described above. The present disclosure also provides a display device comprising the display panel.

The display panel and display device according to the present disclosure can be configured to provide high resolution, and the organic light-emitting layers contained within the display panel and/or display device can be produced using an inkjet printing technique. Further, the configuration and arrangement of the array substrate according to the present disclosure significantly reduce the occurrence of color mixing during the inkjet printing process, so as to improve the efficiency of the printing process.

Figure 6:
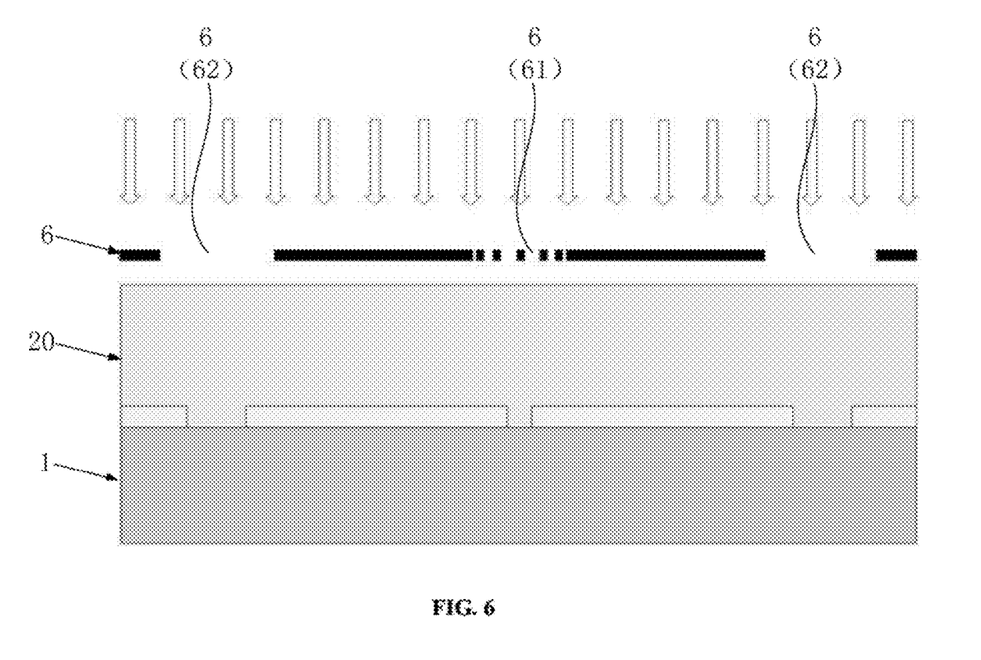
FIG. 6 shows a schematic diagram of the exposure process during the formation of a pixel defining layer on an array substrate according to an embodiment of the present disclosure.
Figure 7:
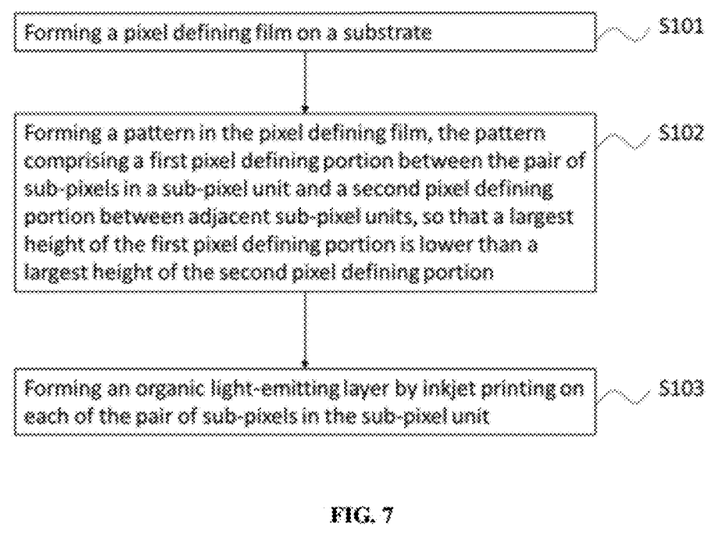
FIG. 7 shows allow chart of a method of fabricating an array substrate according to an embodiment of the present disclosure.

The present disclosure also provides a method of fabricating the array substrate, for example, as shown in FIGS. 1, 6, and 7. The method comprises the following steps.

In step S101, the pixel defining film 20 is deposited on the substrate 1.

In step S102, the pixel defining film 20 is patterned into a pixel defining layer 2 in a patterning process. A first pixel defining portion 21 is provided between the pair of sub-pixels making up the sub-pixel unit, that is, the first pixel defining portion 21 is "intra-unit". A second pixel defining portion 22 is provided between two adjacent sub-pixel units, that is, the second pixel defining portion 22 is "inter-unit". The largest height of the first pixel defining portion 21 is lower than the largest height of the second pixel defining portion 22.

The relative heights of the intra-unit first pixel defining portion 21 and the inter-unit second pixel defining portion 22 make it possible, during the inkjet printing process, to position the printer nozzle 7 over the first pixel defining portion 21 and dispense the proper volume of ink simultaneously into the region of each sub-pixel of a sub-pixel unit 4, as defined by the sub-pixels themselves, for example, as shown in FIGS. 3a to 3c. Further, the risk of ink droplets 30 overflowing into neighboring sub-pixels outside of the sub-pixel unit (for example, due to the large size of the ink droplets 30) is reduced. Even when the resolution of the array substrate is increased, and the size of the sub-pixel units is reduced, the risk of ink droplets overflowing and contaminating neighboring pixels of different colors is low, so as to ensure the uniformity of the color within a sub-pixel unit.

In step S102, the pattern may be formed using a single exposure with a mask 6, for example, as shown in FIGS. 1, 6, and 7. The mask 6 may include a full-exposure region 62 and a half-exposure region 61. During exposure, the half-exposure region 61 corresponds to the intra-unit first pixel defining portion 21, and the full-exposure region 62 corresponds to the inter-unit second pixel defining portion 22. An advantage of using a single exposure is that the cost of production may be materially reduced. The embodiment illustrated in FIG. 6 employs a negative photoresist, but either a positive or a negative photoresist may be employed. When a positive photoresist is employed, the mask pattern may be designed as appropriate according to need.

In some embodiments, the pattern in step S102 may also be formed using a multi-patterning technique. For example, two masks may be used to pattern the pixel defining layer 2, with one mask being used to form the intra-unit first pixel defining portion 21 and the other being used to form the inter-unit second pixel defining portion 22.

The method may additionally include step S103, in which the organic light-emitting layer 3 is formed by inkjet printing. As shown in FIGS. 2 to 3c and 6, the printer nozzle 7 dispenses ink droplets 30 simultaneously onto the two sub-pixels of a sub-pixel unit 4, so as to form an organic light-emitting layer 3 on each of the two sub-pixels simultaneously.

The pixel defining layer 2 as formed in step S102 is configured so that the largest height of the intra-unit first pixel defining portion 21 is lower than the largest height of the inter-unit second pixel defining portion 22. The relative heights of the first and second pixel defining portions 21, 22 make it possible, during the inkjet printing process, to easily dispense the proper volume of ink simultaneously into each the region of a sub-pixel of a sub-pixel unit 4, without risking an overflow of the ink into neighboring sub-pixels outside of the sub-pixel unit 4. As such, the method of fabricating an array substrate according to the present disclosure not only simplifies the inkjet printing process, and in so doing, improves the efficiency of the printing process, but also reduces the risk of undesirable color contamination between neighboring sub-pixels.

Step S103 may additionally include the following steps. As shown in FIGS. 3a to 3c, after the ink has been dispensed onto the sub-pixels, the ink is allowed to dry to form the organic films 32. The thickness of the organic films 32 is preferably smaller than the height of the intra-unit first pixel defining portion 21, so that the organic films 32 on the two sub-pixels of a sub-pixel unit 4 are separated by the first pixel defining portion 21.

In some embodiments, the organic light-emitting layer 3 may comprise a plurality of organic films 32, each configured to perform one or more specific functions. Each organic film 32 may be formed using the inkjet printing process as described in the present disclosure. The organic light-emitting layer 3 may be incorporated into an OLED panel by any means known to a person of ordinary skill in the art. The OLED may additionally comprise an electron transport layer, an electron injection layer, a hole transport layer, a hole injection layer, and/or any other components known to a person of ordinary skill in the art. The OLED can be assembled and obtained by any means known to a person of ordinary skill in the art.

As shown in FIGS. 1 to 3c and 7, the method may further comprise, prior to step S101, a step of forming a pixel electrode 8 on the substrate 1.

A person of ordinary skill in the art readily understands that all or part of the steps of the medication reminder method of the present disclosure may be implemented by hardware, or by programming the applicable hardware with the proper software programs. The software programs may be stored in a computer-readable storage medium, which may be a read-only memory, a magnetic disk, or an optical disk.

It should be appreciated that changes could be made to the embodiments described above without departing from the inventive concepts thereof. It should be understood, therefore, that this invention is not limited to the particular embodiments disclosed, but it is intended to cover modifications within the spirit and scope of the present invention as defined by the appended claims.

What is claimed is:

1. An array substrate, comprising:
    a substrate;
    a plurality of sub-pixel units on a surface of the substrate, wherein each sub-pixel unit comprises a pair of sub-pixels;
    a first pixel defining portion between the pair of sub-pixels in a sub-pixel unit; and
    a second pixel defining portion between adjacent sub-pixel units,
    wherein a largest height of the first pixel defining portion is lower than a largest height of the second pixel defining portion, the largest height of the first pixel defining portion being measured in a direction perpendicular to the surface of the substrate on which the plurality of sub-pixel units are formed;
    each of the first pixel defining portion and the second pixel defining portion comprises a hydrophobic layer and a hydrophilic layer; and
    the hydrophobic layer is provided on a side farthest from the substrate, and the hydrophilic layer is provided on a side closest to the substrate.

2. The array substrate according to claim 1, further comprising an organic light-emitting layer provided on each of the pair of sub-pixels in the sub-pixel unit,
    wherein a height of the organic light-emitting layer is lower than the largest height of the first pixel defining portion.

3. The array substrate according to claim 2, wherein the organic light-emitting layer in the sub-pixel unit is configured to emit lights of a same color.

4. The array substrate according to claim 2, wherein the organic light-emitting layer in adjacent sub-pixel units is configured to emit lights of different colors.

5. The array substrate according to claim 2, comprising a plurality of rows of sub-pixel units, wherein each row comprises an alternating arrangement of at least one first sub-pixel unit configured to emit a blue light, at least one second sub-pixel unit configured to emit a red light, and at least one third sub-pixel unit configured to emit a green light,
    wherein adjacent rows are aligned so that sub-pixel units in other adjacent rows that are configured to emit a same color do not overlap with each other.

6. The array substrate according to claim 2, comprising a first row of sub-pixel units that comprises an alternating arrangement of two selected from the group consisting of a first sub-pixel unit configured to emit a blue light, a second sub-pixel unit configured to emit a red light, a third sub-pixel unit configured to emit a green light, and a fourth sub-pixel unit configured to emit a white light, and
    a second row of sub-pixel units that comprises an alternating arrangement of the other two selected from the group consisting of a first sub-pixel unit configured to emit a blue light, a second sub-pixel unit configured to emit a red light, a third sub-pixel unit configured to emit a green light, and a fourth sub-pixel unit configured to emit a white light,
    wherein the first row and the second row are adjacent to each other and aligned so that the first sub-pixel unit, the second sub-pixel unit, the third sub-pixel unit, and the fourth sub-pixel unit are positioned sequentially about a virtual central point and each sub-pixel unit defines one quadrant about the virtual central point.

7. The array substrate according to claim 2, wherein the first pixel defining portion separates the pair of sub-pixels in the sub-pixel unit, so that no portion of one of the pair of sub-pixels is in contact with the other of the pair of sub-pixels.

8. The array substrate according to claim 1, wherein a largest width of the first pixel defining portion is narrower than a largest width of the second pixel defining portion.

9. A display panel comprising the array substrate according to claim 1.

10. A display device comprising the display panel according to claim 9.

11. A method of fabricating an array substrate, the method comprising:
    forming a plurality of sub-pixel units on a surface of a substrate, wherein each sub-pixel unit comprises a pair of sub-pixels;
    forming a pixel defining film on the substrate;
    forming a pattern in the pixel defining film, wherein the pattern comprises a first pixel defining portion between the pair of sub-pixels in a sub-pixel unit and a second pixel defining portion between adjacent sub-pixel units; and
    forming an organic light-emitting layer on each of the pair of sub-pixels in the sub-pixel unit;
    wherein a largest height of the first pixel defining portion is lower than a largest height of the second pixel defining portion, the largest height of the first pixel defining portion being measured in a direction perpendicular to the surface of the substrate on which the plurality of sub-pixel units are formed;
    forming the pattern comprises exposing the pixel defining film through a single mask; and
    the single mask comprises a half-exposure region corresponding to the first pixel defining portion and a full-exposure region corresponding to the second pixel defining portion.

12. The method according to claim 11, wherein a height of the organic light-emitting layer is lower than the largest height of the first pixel defining portion.

13. The method according to claim 11, wherein a largest width of the first pixel defining portion is narrower than a largest width of the second pixel defining portion.

14. The method according to claim 11, wherein each of the first pixel defining portion and the second pixel defining portion comprises a hydrophobic layer and a hydrophilic layer, and wherein the hydrophobic layer is provided on a side farthest from the substrate, and the hydrophilic layer is provided on a side closest to the substrate.

15. The method according to claim 11, further comprising dispensing ink simultaneously onto the pair of sub-pixels in the sub-pixel unit, and drying the ink to form the organic light-emitting layer.

\* \* \* \* \*